United States Patent [19]

Hoffmeyer et al.

[11] Patent Number: 5,601,675
[45] Date of Patent: Feb. 11, 1997

[54] REWORKABLE ELECTRONIC APPARATUS HAVING A FUSIBLE LAYER FOR ADHESIVELY ATTACHED COMPONENTS, AND METHOD THEREFOR

[75] Inventors: Mark K. Hoffmeyer; David A. Sluzewski, both of Rochester, Minn.

[73] Assignee: International Business Machines Corporation, Armonk, N.Y.

[21] Appl. No.: 349,854

[22] Filed: Dec. 6, 1994

[51] Int. Cl.⁶ ................................... B32B 35/00
[52] U.S. Cl. .................. 156/94; 156/344; 29/402.08; 228/191; 228/264; 428/458; 428/901; 437/209; 437/923
[58] Field of Search ............... 156/94, 344; 29/402.03, 29/402.08, 762; 228/191, 264; 437/923, 209; 428/458, 901

[56] References Cited

U.S. PATENT DOCUMENTS

| | | | |
|---|---|---|---|
| 4,012,832 | 3/1977 | Crane | 29/575 |
| 4,423,435 | 12/1983 | Test, II | 357/65 |
| 4,436,242 | 3/1984 | Shisler et al. | 228/264 |
| 4,673,772 | 6/1987 | Satoh et al. | 174/52 |
| 4,959,507 | 9/1990 | Tanaka et al. | 174/260 |
| 5,060,844 | 10/1991 | Behun et al. | 228/180.2 |
| 5,065,933 | 11/1991 | Basavanhally | 228/102 |
| 5,072,874 | 12/1991 | Bertram et al. | 228/264 |
| 5,202,288 | 4/1993 | Doering et al. | 437/209 |
| 5,268,048 | 12/1993 | Leibovitz et al. | 156/94 |
| 5,310,701 | 5/1994 | Kaussen et al. | 437/209 |

FOREIGN PATENT DOCUMENTS 2050906  1/1981  United Kingdom ................ 228/264

*Primary Examiner*—Mark A. Osele
*Attorney, Agent, or Firm*—Matthew J. Bussan; Andrew J. Dillon

[57] ABSTRACT

An electronics device has unpackaged chips or other small components mounted on a carrier and wire-bonded to carrier wiring traces. The rear chip faces have a layer of adhesive which overlies a layer of solder or other fusible material, and which adheres to a pad area of the carrier. To replace a chip, its solder layer is melted, and the chip and adhesive are pulled off. Reapplying an adhesive layer allows a new chip to be mounted on the carrier and bonded to the traces.

15 Claims, 2 Drawing Sheets

REWORKABLE ELECTRONIC APPARATUS HAVING A FUSIBLE LAYER FOR ADHESIVELY ATTACHED COMPONENTS, AND METHOD THEREFOR

BACKGROUND OF THE INVENTION

The present invention relates to the manufacture of electronics apparatus, and more particularly concerns the construction of such apparatus so as to facilitate rework when defective components are found.

Miniaturized electronics equipment for portable computers, cameras, automobiles, aircraft, space vehicles, and many other applications frequently employ a number of unpackaged semiconductor chips or dice mounted on a carrier having a printed wiring pattern for connecting the chips to each other and to other components. This is commonly known as "direct chip attach" (DCA). The carrier may be a thin rigid sheet of fiberglass epoxy, ceramic, coated metal, or other material; it may also be a flexible sheet of polyamide or other suitable material. Usually the rear faces of the chips are affixed to the carrier with an adhesive, and the chip contacts on the front faces are coupled to the carrier wiring by means of a conventional technique called wire-bonding.

The unpackaged diced chips employed in such applications are difficult to test as individual components; they are small, and placing test probes at the contact points requires operators using microscopes. At the same time, the reliability of unpackaged chips is relatively low: less than 90–95%, even after wafer testing by the supplier. Thus, an assembly of 5–7 chips on a carrier may have an overall manufacturing yield in the range of 70% or even less.

The substantial cost and relatively high fallout of many devices built with DCA technology mandate an inexpensive way to rework assembled devices which have failed a final manufacturing test. However, the adhesives employed to attach chips to carriers commonly do not allow the removal of defective chips or other components from the carrier. This prevents the removal of individual components and the substitution of replacements.

Affixing chips directly to a carrier with solder facilitates easy removal by applying local heat through the chip to melt the solder. An advantage of this technique is that the solder layer for this purpose is commonly required for the mounting of other components on the carrier. That is, attaching the chips requires no process step beyond those already required for other reasons. However, the rear faces of the chips must be metallized so as to wet the solder; this is prohibitively expensive in many cases. Moreover, the thermal expansion coefficients of the chips and the carrier may differ from each other sufficiently to fracture the joint or even the chip.

Some chips are mounted face down directly on a carrier, so that solder balls or columns between the chip contacts and the carrier wiring for electrical contact also hold the chip in place mechanically. This technology also allows removal by local heat, but it is generally not cost-effective except for very high function multichip modules on precision ceramic substrates.

Some workers in this art have employed adhesives which can be melted or softened at elevated temperatures. These adhesive materials do not separate cleanly when a defective chip is removed. They remain partially or entirely on the carrier, and must be removed by prohibitively delicate, expensive, and slow operations such as mechanical grinding and chemical treatment.

SUMMARY OF THE INVENTION

The present invention provides electronics apparatus having semiconductor chips or other very small components attached directly to a carrier by a method which is simple and inexpensive both for initial manufacture and for subsequent rework to replace a defective individual chip or component. In most cases, neither initial construction nor rework requires any additional process steps over those already required for conventional techniques.

Apparatus using the invention avoids damage during rework, and thus has an increased overall yield at a lower final cost. No special tools or machines are needed. Standard solder-deposition or other conventional equipment suffices for manufacture. All materials are already commonly employed in this art. Rework uses only tools and techniques already extant in the industry; the invention incurs no additional expense or retraining.

An electronics device according to the invention has one or more chips or similar components mounted at pad areas of a carrier and coupled to a wiring pattern on the carrier by wires or similar means bonded to their front faces. Each replaceable component has a rear face contacting a layer of adhesive which overlies a layer of fusible material. The fusible layer adheres to the component's pad area of the carrier.

The device is constructed by coating the chip-mounting pad areas with a layer of fusible material such as solder, and then overlaying this layer with a layer of adhesive, which need not be removable or softenable. The components are placed on the adhesive layer; the adhesive is cured by heat or other appropriate means; and the component connections are made to the carrier wiring by wire-bonding or similar techniques. Then, if the component needs to be replaced, local heat applied through the carrier or the component melts the fusible layer and releases the chip and the adhesive cleanly. Applying a new layer of adhesive to the affected pad area then allows a replacement component to be mounted and wired in the same way as the original. This process can be repeated without damaging the device.

DESCRIPTION OF PREFERRED EMBODIMENT

Figure 1:
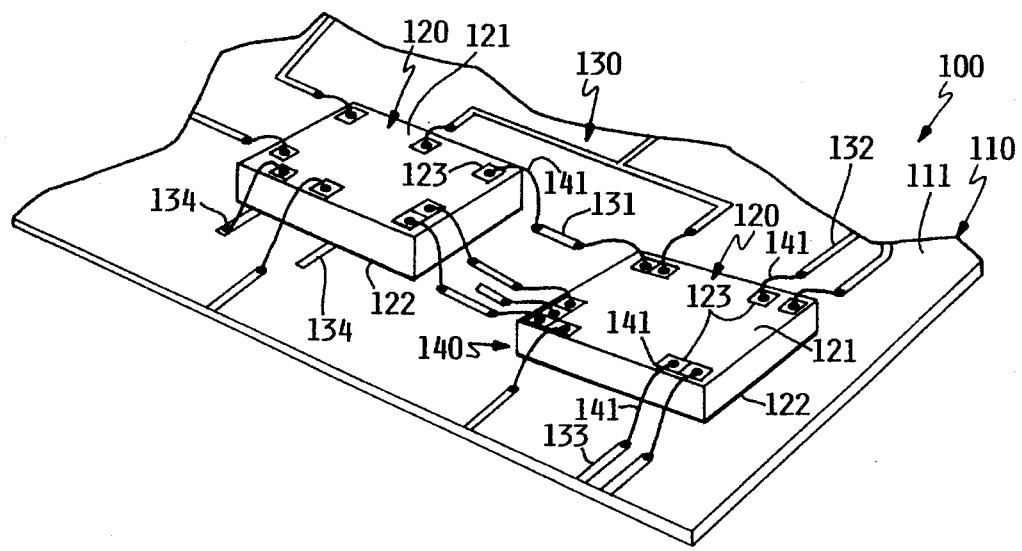
FIG. 1 shows an electronics card embodying the invention.

FIG. 1 shows a portion of an electronics apparatus 100 in which a carrier or card 110 supports and interconnects a number of components 120 on a planar surface 111. Carrier 110 may be any one of a number of conventional materials, either rigid or flexible. Wiring pattern 130 has traces such as 131 for interconnecting components 120, traces such as 132 leading to other components (not shown), and traces such as 133 which may provide off-card contacts, or which may couple to off-card connectors (not shown), and traces such as 134 which may connect to chip mounting pads present under components 120.

Components 120 are shown as conventional semiconductor chips which have front faces 121 and large, flat rear faces 122. The rear faces are mechanically attached to the surface carrier 110 as described in connection with FIG. 2. The front faces contain the chip's external electrical contacts such as 123. These are electrically coupled to wiring traces such as 131–133 by individual connections 140, such as fine wires 141, in a conventional technique known as wire-bonding. The general technique of attaching the rear face of components to a carrier and the electrical contacts to wiring traces on the carrier is known as "direct attach" or "direct chip attach" (DCA). It is used to achieve high interconnection density with minimum number of interconnections and package space minimization with enhanced thermal performance.

Figure 2:
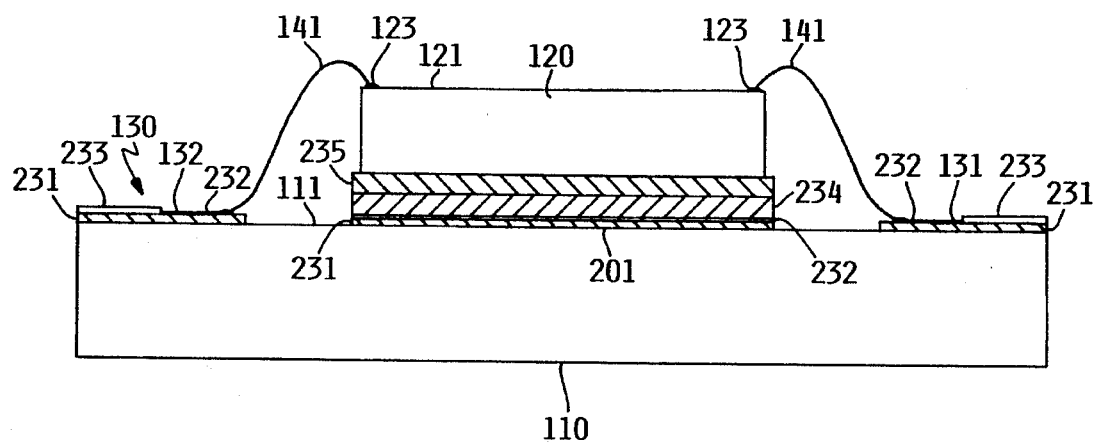
FIG. 2 is a cross section showing one component of FIG. 1.

FIG. 2 details the manner in which a chip 120 attaches to carrier 110 at a particular chip-mounting pad location 201. A conductive layer 231 deposited in any conventional manner defines both the wiring 130 and the pad location 201. A conventional overplate 232 of electroless Ni/Au or a combination of other materials can be used to enhance the bonding characteristics for wires 141, if required. Masked areas 233 are also conventional. A screen-printed organic covercoat serves for rigid circuit boards; a laminated polyimide/adhesive layer serves well for flexible carriers; a screened and fired inorganic material is usually appropriate for ceramic carriers, although organics may be used here as well. Fusible layer 234 overlies the entire area of pad 201, which is about the same size as rear face 122 of chip 120. Layer 234 may be a layer of ordinary solder, a special type of solder such as lead-free, a brazing alloy, or any other substance compatible with the carrier material, the wiring, and other components of apparatus 100. For the present purpose, the melting temperature must obviously exceed the normal operating temperature of the apparatus, and must be low enough that it can flow and reflow without damaging the material of carrier 110; melting temperature is typically in the range of 100 C. to 400 C. Adhesive layer 235 extends over substantially all of the pad area of each chip, overlying fusible layer 234 and contacting rear face 122 of chip 120. Adhesive 235 may be a permanent type; unlike chip adhesives for some conventional rework applications, it need not be heat-softenable in order to provide rework capability; this allows the use of some adhesive materials which sacrifice softenability or tearability in order to achieve higher bond strength or other desirable properties. For some applications, the adhesive may be electrically insulating; for others, it may be electrically conductive to provide electrical connection or enhanced heat conduction to the carrier. Typical adhesive materials include epoxies, either insulating or made electrically conductive by impregnation with metal particles. Electrically insulating adhesives can be made thermally conductive for good heat transfer, by impregnating them with particles of diamond, BN, AlN, silica, ZnO, etc.

Figure 3:
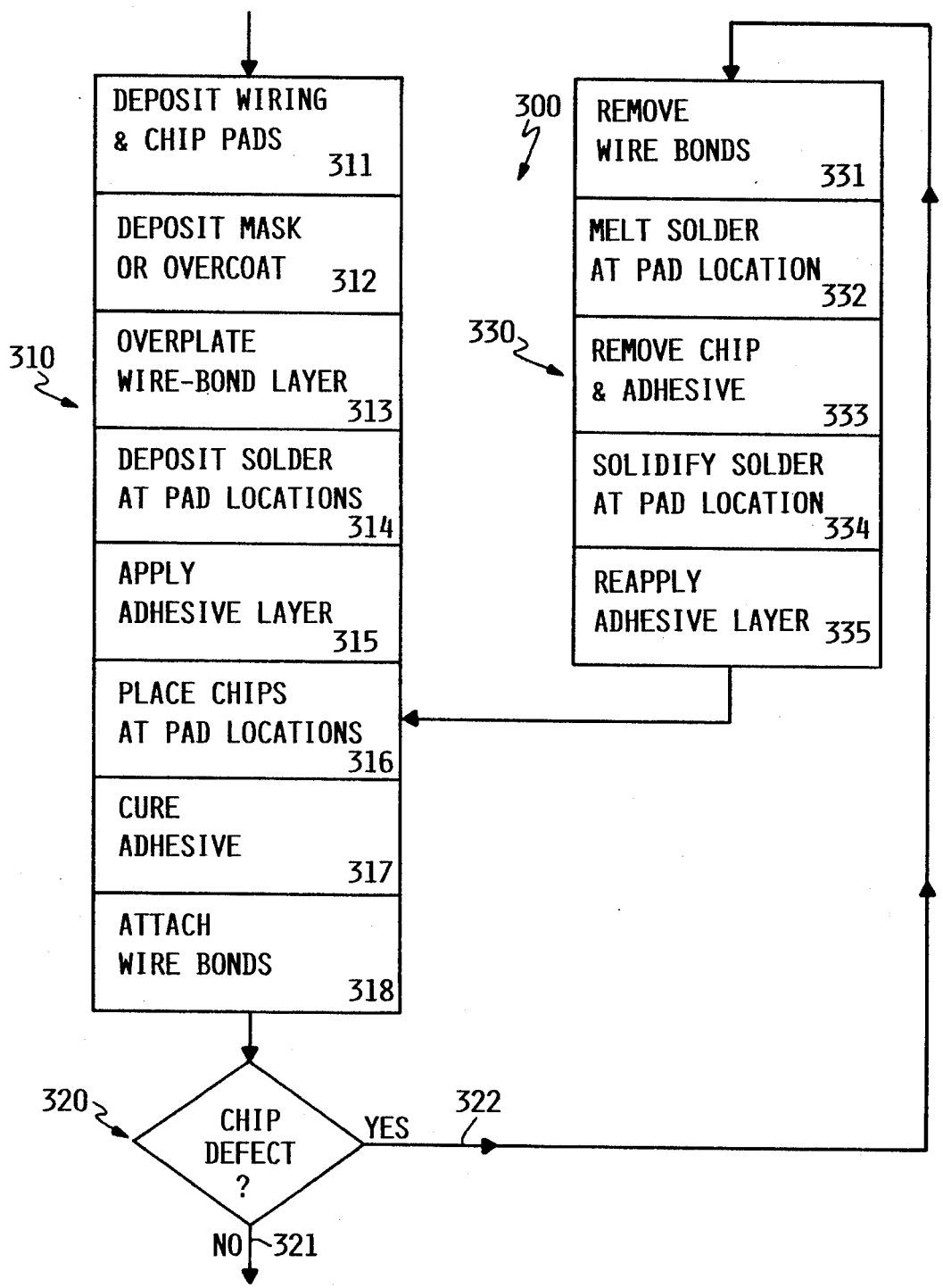
FIG. 3 describes a method of manufacturing and reworking electronics apparatus according to the invention.

FIG. 3 illustrates a method 300 for manufacturing and reworking an apparatus according to the invention. Blocks 310 concern the original construction of a complete apparatus 100 as described in FIGS. 1 and 2.

Starting at block 311, the wiring traces 130 and pad locations are formed in a conventional manner, such as by etching or screen-printing copper, nickel, or other conductive material on a screened fiberglass/epoxy laminate, polyamide, or metal-core substrate. Thick- or thin-film wiring may also be used with ceramic substrates or organic carriers.

Block 312 then lays down a covercoat or mask on the carrier to define the pad areas. In most applications, this same mask also defines the wire-bond interconnection areas for the wiring pattern and the direct-connect contacts for other components, so that no extra steps are required to implement the present invention.

Block 313 optionally adds a thin overplate of gold or other material to enhance the bondability of the wires and the fusible layer. Step 313 may not be needed for some wiring materials which already have a suitable noble-metal surface or which are sufficiently clean to provide bondability.

Step 314 adds fusible layer 234, FIG. 2, onto the pad areas 201 and onto any other areas defined in step 312. That is, this step also usually occurs during the manufacture of conventional electronics apparatus, so that the invention rides along for free. The fusible material may be a eutectic Pb/Sn solder, but may also comprise other materials optimized for various purposes, such as environmental protection or avoidance of toxic substances. Non-eutectic Pb/Sn alloys, as well as Sn/In and Sn/Bi binary alloys, are appropriate; ternary alloys of Cu, Ag, Au, In, Sb, Bi, Zn, Pd, etc. with Pb/Sn, Sn/In, and Sn/Bi may also be preferred in some cases. Brazing alloys such as Sn/Au may also be employed. Layer 234 is referred to hereinafter as "solder", regardless of its actual composition. The addition of solder 234 involves standard techniques such as stencilling or screening solder paste followed by vapor-phase reflow, or reflow by infrared radiation, hot air, or a hot plate. Wave-soldering and solder levelling are common alternatives. For mounting semiconductor chips, solder layer 234 normally covers pad areas in the range of 2–25 mm on a side, and has a conventional thickness of roughly 0.001–0.25 mm. The thickness is determined by known considerations such as metal reactivity and adequate liquid film formation for subsequent chip removal.

Block 315 applies adhesive layer 235 over substantially the entire extent of fusible layer 234 in the pad areas. This step entails nothing above the manufacture of conventional adhesive DCA apparatus, and can in addition relax the requirements for the adhesive material. The adhesive material can be optimized for strength and other characteristics without regard to any need that it be capable of softening at elevated temperatures; unlike conventional adhesives for reworkable devices, it is desirable here that the adhesive remain firmly attached to the chip 120 at elevated temperatures, so that it will pull away completely with the chip during the rework phase. Examples of suitable materials include commercially available epoxies such as EMCA-REMEX products including Ablestik and Ablebond; other available products include Polysolder from Alpha Metals, and conductive and nonconductive adhesives manufactured by AI Technologies, as well as Acheson brand adhesives. Additional preferred adhesives include acrylics, silicones, and other polymer-based materials. Layer 235 is preferably screened, stencilled, or dispensed onto the pad areas. An alternative is B-staged (partially cured) sheets of cut adhesive that are placed on the chip-mounting pads 201 by manual or automatic means. (B-staged adhesives are conventionally employed to assemble circuit-board cores and multi-layer flex circuitry.) It is also possible in some cases to apply an adhesive to the rear face of chip 120 instead of, or in addition to, carrier 110.

Step 316 places the chip 120 upon the pad area 201 so that adhesive layer 235 comes into contact with fusible layer 234 over substantially all of the pad area. Block 317 cures the adhesive to form essentially a permanent bond between chip 120 and the fusible layer. Curing may be by simple air drying at room temperature or at an elevated temperature, or by infrared or microwave curing operations.

Block 318 represents a wire-bonding operation for connecting wires 141 between chip contacts 123 and individual wiring traces 131–133. Wire-bonding may take place during the curing step for some adhesive materials. Conventional connection techniques other than wire-bonding may sometimes be preferred.

Block 320 concerns testing or inspecting electronics apparatus 100. This normally takes place at manufacture, but may occur later, such as during preventive maintenance or diagnostics. If no problem is detected, leg 321 indicates that no further action is required. Discovery of a defect in an originally installed component 120, however, causes leg 322 to initiate a rework sequence 330 for apparatus 100.

In step 331, an operator removes leads 141 of the defective original chip 120. In step 332, the operator applies sufficient heat to melt fusible layer 234 in the pad area of the chip or component to be replaced. One preferred approach employs a conventional hot-gas rework tool or a small desoldering tool to front face 121 of chip 120 so that the heat will pass through it to layer 234. Another preferred approach applies localized heat from the rear of carrier 110. As explained previously, the melting temperature of layer 234 is chosen to be low enough to avoid damage to the material of carrier 110, conveniently 100 C. to 400 C. Although it is immaterial whether or not the heat would damage the defective chip 120, this amount of heat is normally low enough to avoid further chip damage, so as to allow failure analysis if desired.

The operator then removes the original chip 120 with a vacuum pickup, tweezers, or similar tool (not shown) in step 333. Unlike conventional rework methods using adhesively-mounted chips, the present process causes the entire adhesive layer to come away from the pad location 201 on the carrier, leaving no scraps on the carrier and thus avoiding the necessity for cleaning or grinding the carrier. Removing the chip usually leaves solder layer 234 in the same condition as it was before the chip was attached, especially if the adhesive retains a high bond strength at elevated temperatures, as most desirable adhesives do.

Step 334 solidifies the fusible material by any convenient means. For most materials, mere cooling below its melting point reforms layer 234 substantially to its original condition, i.e., as it existed after step 314, without further treatment. Unlike previous rework methods, the present method does not normally require reconstituting, cleaning, smoothing, or otherwise preparing the pad surface before rework can proceed.

Block 335 represents the application of another layer of adhesive 235, this time only to pad 201 at the site of the component removed in step 333. (The new adhesive could be applied to the rear face of the replacement chip instead of to the carrier pad area; however, handling the large carrier is most often easier than manipulating the small chip.)

The remaining steps are the same as shown in blocks 316–318: a replacement chip 120 is positioned by hand or machine on the pad, the new adhesive is cured, and new wires 141 are bonded between chip contacts 123 and wiring traces 131–133.

Should a subsequent test 320 find this chip in turn to be defective, another rework operation 330 can be initiated. The same apparatus 100 may be reworked a number of times by this method.

Having described preferred and alternative embodiments thereof, we claim as our invention:

1. A method of fabricating an electronics apparatus including components each having a relatively large flat face at a pad location of a carrier having wiring means for interconnecting such components and possibly other components, comprising:

coating said carrier at said pad locations with a layer of fusible material having a selected melting temperature;

coating said layer of fusible material with a layer of adhesive material having a melting temperature substantially greater than said selected melting temperature;

fixedly attaching said components to said layer of adhesive material at said pad location;

connecting said components to said wiring means on said carrier;

determining that one of said original components at one of said pad locations must be replaced;

applying heat to said fusible layer sufficient to melt it at said one pad location while not affecting said layer of adhesive material;

mechanically separating said one component and all of said layer of adhesive material at said one pad location, from said carrier;

replacing said layer of adhesive material above said layer of fusible material at said one pad location;

fixedly attaching a replacement component at said one pad location; and connecting said replacement component to said wiring means on said carrier.

2. The method according to claim 1, wherein said carrier is substantially planar.

3. The method according to claim 2, wherein said carrier is rigid.

4. The method according to claim 2, wherein said carrier is flexible.

5. The method according to claim 1, wherein said fusible layer is a solder.

6. The method according to claim 1, wherein said adhesive is a polymeric material.

7. The method according to claim 1, wherein both of said connecting steps comprise wire-bonding said components to said wiring means on said carrier.

8. A reworkable electronic apparatus, comprising:

a carrier having a pad location thereon;

a layer of fusible material on said carrier covering said pad location, said material being fusible at a first temperature which is below that which would damage said carrier;

an electronic component having a relatively large flat face;

a layer of adhesive material adhering both to the flat face of said component and to said layer of fusible material at said pad location, said layer of adhesive material having a melting temperature substantially greater than said first temperature such that upon application of heat at said first temperature said electronic component and all of said layer of said adhesive material may be removed;

wiring means on said carrier for connecting said component to further components; and a plurality of electrical connections between said component and said wiring means.

9. The apparatus according to claim 8, wherein said carrier is substantially planar.

10. The apparatus according to claim 9, wherein said carrier is rigid.

11. The apparatus according to claim 9, wherein said carrier is flexible.

12. The apparatus according to claim 8, wherein said fusible layer is a solder.

13. The apparatus according to claim 8, wherein said adhesive is a polymeric material.

14. The apparatus according to claim 13, where said adhesive material covers substantially all of said fusible layer in a continuous layer at said pad location.

15. The apparatus according to claim 8, wherein said electrical connections comprise a plurality of individual wires bonded between said component and said wiring means on said carrier.

* * * * *